United States Patent
Yan et al.

(10) Patent No.: US 9,680,434 B2
(45) Date of Patent: Jun. 13, 2017

(54) METHOD AND APPARATUS FOR CALIBRATING AN ENVELOPE TRACKING SYSTEM

(71) Applicant: MEDIATEK INC., Hsin-Chu (TW)

(72) Inventors: Sheng-Hong Yan, Tainan (TW); Paul Cheng Po Liang, Hsinchu County (TW)

(73) Assignee: MediaTek, Inc., Hsin-Chu (TW)

( * ) Notice: Subject to any disclaimer, the term of this patent is extended or adjusted under 35 U.S.C. 154(b) by 0 days.

(21) Appl. No.: 13/956,376

(22) Filed: Aug. 1, 2013

(65) Prior Publication Data

US 2014/0187182 A1 Jul. 3, 2014

Related U.S. Application Data

(60) Provisional application No. 61/746,685, filed on Dec. 28, 2012.

(51) Int. Cl.
*H01Q 11/12* (2006.01)
*H04B 1/04* (2006.01)
(Continued)

(52) U.S. Cl.
CPC ........... *H03G 3/004* (2013.01); *H03F 1/0216* (2013.01); *H03F 1/0222* (2013.01);
(Continued)

(58) Field of Classification Search
CPC ...... H03G 3/3042; H03G 3/3047; H03F 3/24; H03F 1/3247; H04B 2001/0416
(Continued)

(56) References Cited

U.S. PATENT DOCUMENTS 6,438,360 B1 * 8/2002 Alberth et al. ............... 455/110
6,633,750 B1 * 10/2003 Dacus et al. .................. 455/126
(Continued)

FOREIGN PATENT DOCUMENTS

| CN | 1663115 A1 | 5/2005 |
| CN | 10186734 A1 | 10/2010 |
| TW | 200803154 A1 | 1/2008 |

OTHER PUBLICATIONS

Kim, Optimization for Envelope Shaped Operation of Envelope Tracking Power Amplifier, pp. 1787-1795, IEEE Transactions on Microwave Theory and Techniques, vol. 59, No. 7, Jul. 2011.

*Primary Examiner* — Simon Nguyen
(74) *Attorney, Agent, or Firm* — Optimus Patents US, LLC

(57) ABSTRACT

A method of calibrating an envelope tracking system for a supply voltage for a power amplifier module within a radio frequency (RF) transmitter of a wireless communication unit is described. The method comprising, within at least one signal processing module of the wireless communication unit, applying a training signal comprising an envelope that varies with time to an input of the RF transmitter, receiving at least an indication of instantaneous output signal values for the power amplifier module in response to the training signal, calculating instantaneous gain values based at least partly on the received output power values, and adjusting a mapping function between an instantaneous envelope of a waveform signal to be amplified by the power amplifier module and the power amplifier module supply voltage to achieve a power amplifier module gain, for example that is monotonically increasing as a function of power amplifier output power.

18 Claims, 6 Drawing Sheets

(51) Int. Cl.
- *H03G 3/00* (2006.01)
- *H03F 1/02* (2006.01)
- *H03G 3/30* (2006.01)
- *H03F 1/32* (2006.01)
- *H03F 3/19* (2006.01)
- *H03F 3/24* (2006.01)

(52) U.S. Cl.
CPC ............ *H03F 1/3247* (2013.01); *H03F 3/19* (2013.01); *H03F 3/245* (2013.01); *H03G 3/3042* (2013.01); *H03F 2200/102* (2013.01); *H03F 2201/3233* (2013.01)

(58) Field of Classification Search
USPC ............... 455/114.2–114.3, 127.1–127.2
See application file for complete search history.

(56) References Cited

U.S. PATENT DOCUMENTS

| | | | |
|---|---|---|---|
| 6,725,021 B1* | 4/2004 | Anderson et al. | 455/115.1 |
| 7,817,970 B2* | 10/2010 | Puma | 455/114.3 |
| 8,093,946 B2 | 1/2012 | Wimpenny | |
| 8,565,699 B1* | 10/2013 | Lipshitz et al. | 455/127.2 |
| 8,934,854 B2* | 1/2015 | McCallister | 455/114.3 |
| 2002/0094795 A1* | 7/2002 | Mitzlaff | 455/245.1 |
| 2003/0095012 A1* | 5/2003 | Chethik et al. | 332/103 |
| 2007/0178856 A1* | 8/2007 | Mitzlaff et al. | 455/127.1 |
| 2007/0207749 A1* | 9/2007 | Rozenblit et al. | 455/127.2 |
| 2007/0249382 A1* | 10/2007 | Trachewsky et al. | 455/522 |
| 2009/0004981 A1* | 1/2009 | Eliezer et al. | 455/127.1 |
| 2009/0088093 A1* | 4/2009 | Nentwig | 455/114.3 |
| 2010/0253426 A1* | 10/2010 | Su et al. | 330/149 |
| 2010/0295613 A1* | 11/2010 | Asbeck et al. | 330/149 |
| 2012/0106676 A1* | 5/2012 | McCallister et al. | 375/297 |
| 2012/0108189 A1* | 5/2012 | McCallister et al. | 455/127.2 |
| 2012/0194274 A1* | 8/2012 | Fowers et al. | 330/293 |
| 2012/0200354 A1* | 8/2012 | Ripley | H03F 1/0227 330/131 |
| 2013/0072139 A1* | 3/2013 | Kang et al. | 455/114.3 |
| 2013/0076418 A1* | 3/2013 | Belitzer et al. | 327/161 |
| 2013/0095777 A1* | 4/2013 | Muhammad | H04W 52/52 455/127.2 |
| 2013/0109442 A1* | 5/2013 | Dakshinamurthy et al. | 455/571 |
| 2013/0142220 A1* | 6/2013 | Jin et al. | 375/146 |
| 2013/0214862 A1* | 8/2013 | Presti et al. | 330/151 |
| 2013/0229228 A1* | 9/2013 | Drogi | 330/127 |
| 2013/0257531 A1* | 10/2013 | Tanio | 330/149 |
| 2013/0285743 A1* | 10/2013 | Onishi | 330/149 |
| 2014/0015604 A1* | 1/2014 | Eschlboeck et al. | 330/131 |
| 2014/0065986 A1* | 3/2014 | McCallister | 455/91 |
| 2014/0073273 A1* | 3/2014 | Asensio et al. | 455/114.3 |
| 2014/0135050 A1* | 5/2014 | Goedken et al. | 455/509 |
| 2014/0155128 A1* | 6/2014 | Dakshinamurthy | H04W 52/0209 455/574 |
| 2014/0248844 A1* | 9/2014 | Langer | 455/127.2 |

\* cited by examiner

METHOD AND APPARATUS FOR CALIBRATING AN ENVELOPE TRACKING SYSTEM

CROSS REFERENCE TO RELATED APPLICATIONS

This application claims the benefit of U.S. provisional application No. 61/746,685, filed on Dec. 28, 2012 and incorporated herein by reference.

BACKGROUND

The field of this invention relates to a method and apparatus for calibrating an envelope tracking system, and in particular to a method and apparatus for calibrating an envelope tracking system of a radio frequency (RF) transmitter of a wireless communication unit using power-aware power amplifier gain mapping.

Continuing pressure on the limited spectrum available for radio communication systems is forcing the development of spectrally-efficient linear modulation schemes. Since the envelopes of a number of these linear modulation schemes fluctuate, these result in the average power delivered to an antenna being significantly lower than a maximum available power, leading to poor efficiency use of the power amplifier. Specifically, in this field, there has been a significant amount of research effort in developing high-efficiency topologies capable of providing high performances in the 'back-off' (linear) region of the power amplifier.

Linear modulation schemes require linear amplification of the modulated signal, in order to minimise undesired out-of-band emissions resulting from spectral re-growth. However, the active devices used within a typical RF amplifying device are inherently non-linear by nature. Only when a small portion of the consumed DC power is transformed into RF power, can the transfer function of the amplifying device be approximated by a straight line, i.e. as in an ideal linear amplifier case. This mode of operation provides a low efficiency of DC-to-RF power conversion, which is unacceptable for portable (subscriber) wireless communication units. Furthermore, low efficiency is also recognised as being problematic for base stations in wireless communication systems.

Additionally, an emphasis in portable (subscriber) equipment is to increase battery life. To achieve both linearity and efficiency, so called linearization techniques are used to improve the linearity of the more efficient amplifier classes, for example class 'AB', 'B' or 'C' amplifiers. A number and variety of linearizing techniques exist, which are often used in designing linear transmitters, such as Cartesian Feedback, Feed-forward, and Adaptive Pre-distortion.

Voltages at the output of the linear, e.g. Class AB, amplifier are typically set by the requirements of the final RF power amplifier (PA) device. Generally, the minimum voltage of the PA is significantly larger than that required by the output device of the Class AB amplifier. Hence, they are not the most efficient of amplification techniques. The efficiency of the transmitter (primarily the PA) is determined by the voltage across the output components/devices, as well as any excess voltage across any pull-down device components, due to the minimum supply voltage (Vmin) requirement of the PA.

Current communication systems and communication units need to support signals with wide bandwidth and high peak-to-average power ratio (PAPR). In order to increase the bit rate used in transmit uplink communication channels, larger constellation modulation schemes, with an amplitude modulation (AM) component, are being investigated and, indeed, becoming required. These modulation schemes, such as sixteen-state quadrature amplitude modulation (16-QAM), require linear PAs and are associated with high 'crest' factors (i.e. a degree of fluctuation) of the modulation envelope waveform. This is in contrast to the previously often-used constant envelope modulation schemes and can result in significant reduction in power efficiency and linearity.

A conventional power amplifier (PA) with a fixed supply voltage (VPA) should be operated at the so-called 'back-off' region. However, the PA supply voltage is also typically set high enough to linearly amplify high PAPR signals. Thus, a large portion of the supplied energy is dissipated as heat when the instantaneous power is lower than the peak power, thereby making the efficiency of the power stages of the transmitter when operating at lower power to be much less than when operating at peak output power.

To help overcome such efficiency and linearity issues a number of solutions have been proposed. One of the more popular efficiency improvement techniques is known as envelope tracking (ET) and relates to modulating the PA supply voltage to match (track) the envelope of the radio frequency waveform being transmitted by the RF PA. With envelope tracking (ET), the instantaneous PA supply voltage of the wireless transmitter is caused to approximately track the instantaneous envelope (ENV) (e.g. amplitude) of the transmitted quadrature (I/Q) radio frequency signals. Thus, since the power dissipation in the PA is proportional to the difference between its supply voltage and output voltage, envelope tracking enables an increase in PA efficiency, reduces heat dissipation, improves linearity and increases maximum linear output power, whilst allowing the PA to produce the intended RF output. Since the overall efficiency of an ET systems is proportional to the PA efficiency, optimized design of envelope (ENV) shaping function is very important.

FIG. 1 illustrates a graphical representation 100 of the aforementioned two alternative PA supply voltage techniques; a first technique that provides a fixed supply voltage 105 to a PA, and a second technique whereby the PA supply voltage is modulated to track the RF envelope waveform 115. In the fixed supply voltage case, excess PA supply voltage headroom 110 is used (and thereby wasted), irrespective of the nature of the modulated RF waveform being amplified.

However, for example in the PA supply voltage tracking of the RF modulated envelope case 115, excess PA supply voltage headroom can be reduced 120 by modulating the RF PA supply, thereby enabling the PA supply to accurately track the instant RF envelope.

The mapping function between envelope and the variable PA supply voltage (Vpa) is critical for optimum performance (e.g. efficiency, gain, and adjacent channel power (ACP)). FIG. 1 also shows graphically 150 a plot of PA gain 155 versus output power (Pout) 160 for various fixed supply voltages with a maximum gain 165 of 28 dB for each fixed supply voltage reduced through gain compression 170 to an operating gain 175 of 25 dB.

Envelope-tracking can be combined with digital pre-distortion (DPD) on the RF signal to improve ACP robustness. The inventors of the present invention have also recognized and appreciated that envelope tracking with equal-gain mapping has several limitations, for example a lower equal-gain target provides better PA efficiency (but the efficiency improvement is limited due to the limited maximum output power capability of the RF transceiver) and that DPD AM/AM compensation may be insufficient to overcome high PA gain compression.

US 2012/0105150 A1, titled 'joint optimization of supply and bias modulation', describes an ET LUT that is populated to linearize a PA based solely on determined PA amplitude modulated-to-amplitude modulated (AM/AM) characteristics. The described technique uses an envelope shaping technique to provide maximum linearity whilst using fixed gain, irrespective of the required output power and supply voltage. The inventors have identified that lower equal-gain target provides good PA efficiency, but the efficiency improvement is limited due to the limited maximum output power capability of the RF transceiver.

A paper by D. Kim et al., titled 'optimization for envelope shaped operation of envelope tracking power amplifier', published in IEEE TMTT, vol. 59, no. 7, July 2011, pp. 1787-1795, describes a sweet-spot tracking technique that populates an ET LUT in order to adjust the supply voltage to follow the sweet spot points at each output power level to maintain good PA linearity.

Thus, there is a need for an efficient and cost effective solution to the problem of ET system calibration. In particular, it would be advantageous to provide an increased efficiency-improvement range whilst operating under current RF transceiver output power constraints.

SUMMARY

Accordingly, the invention seeks to mitigate, alleviate or eliminate one or more of the above mentioned disadvantages singly or in any combination. Aspects of the invention provide a method and apparatus for calibrating an envelope tracking system for a supply voltage for a power amplifier module within a radio frequency, RF, transmitter of a wireless communication unit.

According to a first aspect of the invention, there is provided a method of calibrating an envelope tracking system for a supply voltage for a power amplifier module within a radio frequency (RF) transmitter. The method comprises, within at least one signal processing module of the wireless communication unit, applying a signal comprising an envelope that varies with time to an input of the RF transmitter; determining an indication of at least one instantaneous output signal value for the power amplifier module; mapping a gain of the power amplifier module to an instantaneous power of a waveform signal to be amplified by the power amplifier module; and applying a supply voltage to the power amplifier module based on the mapping.

In this manner, gain compensation, for example in a digital predistorter, may be applied to adaptively compress PA gain according to the instantaneous PA output power, hereinafter sometimes referred to as 'power-aware' PA gain mapping. For example, when the output power is close to a PA saturation power, the PA gain will be compressed less, thereby relaxing RF transceiver output power requirement at high PA output power. Alternatively, when the output power is several dB smaller than PA saturation power, the PA gain will be compressed more as the output power decreases, thereby improving PA efficiency at low PA output power. In this manner, the ET operation range may be increased as the efficiency at lower output power is improved.

According to an optional example, mapping the gain of the power amplifier module to the instantaneous power may comprise monotonically increasing a power amplifier gain as a function of power amplifier output power.

According to an optional example, mapping the gain of the power amplifier module to the instantaneous power may comprise mapping a reduction in power amplifier gain as the instantaneous power of the power amplifier output decreases.

According to an optional example, mapping the gain of the power amplifier module to the instantaneous power may comprise digital pre-distortion mapping.

According to an optional example, mapping the gain of the power amplifier module to the instantaneous power of a waveform signal to be amplified by the power amplifier module may comprise: determining a system linear gain for at least one average output power that may be output from the power amplifier module; determining a transmitter gain setting for at least one average output power that may be output from the power amplifier module; determining a gain setting of the power amplifier module for at least one instantaneous output power from the power amplifier module; and determining therefrom digital predistortion gain compensation to be applied to a digital predistorter to adaptively compress power amplifier module gain according to the at least one instantaneous output power.

According to an optional example, the method may further comprise performing envelope tracking (ET) calibration by determining a supply voltage to be applied to the power amplifier module for the at least one instantaneous output power. In one example, the method may further comprise determining therefrom amplitude modulated-to-phase modulated (AM/PM) to be applied to achieve at least one instantaneous output power to be output from the power amplifier module. In one example, the method may further comprise applying the digital pre-distortion amplitude modulated to phase modulated compensation when power amplifier gain compression is high.

According to an optional example, the method may further comprise storing the digital pre-distortion amplitude modulated to phase modulated compensation values in the at least one look-up table.

According to an optional example, the method may further comprise mapping digital pre-distortion amplitude modulated-to-phase modulated compensation in a first look-up table and mapping digital pre-distortion amplitude modulated-to-amplitude modulated compensation in a second look-up table.

According to an optional example, the method may further comprise calibrating determining an indication of at least one instantaneous output signal value for the power amplifier module.

According to an optional example, the at least one instantaneous output signal value may comprise at least one of: instantaneous power, instantaneous envelope, instantaneous phase According to a second aspect of the invention, there is provided a non-transitory computer program product comprising executable program code for calibrating an envelope tracking system for a supply voltage for a power amplifier module within a radio frequency (RF) transmitter of a wireless communication unit, the executable program code operable for, when executed at a communication unit, performing the method of the first aspect.

According to a third aspect of the invention, there is provided a communication unit comprising: a radio frequency, RF, transmitter comprising an envelope tracking system for a supply voltage for a power amplifier module within the RF transmitter; and at least one signal processing module for calibrating envelope tracking system. The at least one signal processing module is arranged to: apply a signal comprising an envelope that varies with time to an input of the RF transmitter; determine an indication of at least one instantaneous output signal value for the power amplifier module; map a gain of the power amplifier module to an instantaneous power of a waveform signal to be amplified by the power amplifier module; and apply a supply voltage to the power amplifier module based on the mapping.

According to a fourth aspect of the invention, there is provided an integrated circuit for a communication unit comprising a radio frequency, RF, transmitter comprising an envelope tracking system for a supply voltage for a power amplifier module within the RF transmitter. The integrated circuit comprises at least one signal processing module for calibrating the envelope tracking system. The at least one signal processing module being arranged to: apply a signal comprising an envelope that varies with time to an input of the RF transmitter; determine an indication of at least one instantaneous output signal value for the power amplifier module; map a gain of the power amplifier module to an instantaneous power of a waveform signal to be amplified by the power amplifier module; and apply a supply voltage to the power amplifier module based on the mapping.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

A primary focus and application of the present invention is the field of radio frequency (RF) power amplifiers capable of use in wireless telecommunication applications. Examples of the invention will be described in terms of one or more integrated circuits for use in a wireless communication unit, such as user equipment in third generation partnership project (3GPP™) parlance. However, it will be appreciated by a skilled artisan that the inventive concept herein described may be embodied in any type of integrated circuit, wireless communication unit or wireless/radio frequency transmitter that comprises or forms a part of an envelope tracking system.

Examples of the invention are described in terms of a PA gain mapping technique, for example by introducing amplitude-modulation to amplitude-modulation (AM/AM) compensation into a look-up table set of values in a digital pre-distortion (DPD) envelope tracking architecture. In this manner, DPD gain compensation may be applied to adaptively compress PA gain according to the instantaneous PA output power, hereinafter sometimes referred to as 'power-aware' PA gain mapping. For example, when the output power is close to a PA saturation power, the PA gain will be compressed less, thereby relaxing RF transceiver output power requirement at high PA output power. Alternatively, when the output power is several dB smaller than PA saturation power, the PA gain will be compressed more as the output power decreases, thereby improving PA efficiency at low PA output power. In this manner, the ET operation range may be increased as the efficiency at lower output power is improved.

In some examples, PA AM/PM compensation may be employed for both equal-gain and power-aware gain mapping when PA gain compression is high in order to overcome PA AM/PM non-linearity.

In some examples, the envelope tracking operation range may increase as the efficiency at lower output power is improved. In some examples, as the PA supply voltage may be operated using a smaller high frequency component with smaller efficiency improvement. An efficiency improvement using embodiments of the invention may offer a possibility to trade off the efficiency improvement and signal bandwidth on an envelope tracking path.

Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Figure 1:
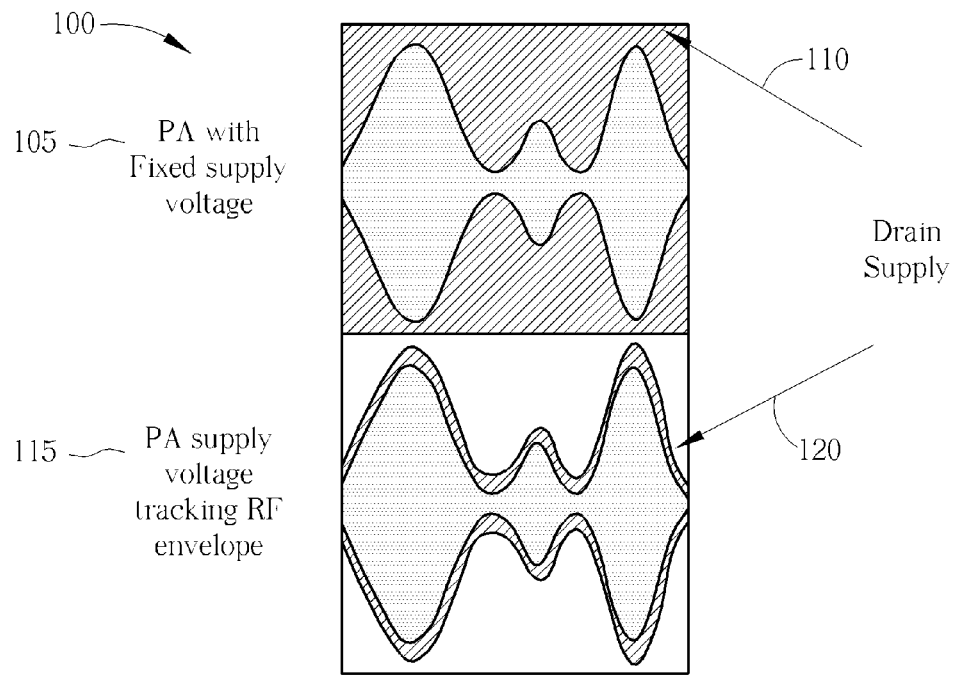
FIG. 1 illustrates a graphical representation of two known alternative power amplifier (PA) supply voltage techniques together with gain versus output power (Pout) for various fixed supply voltages.
Figure 1:
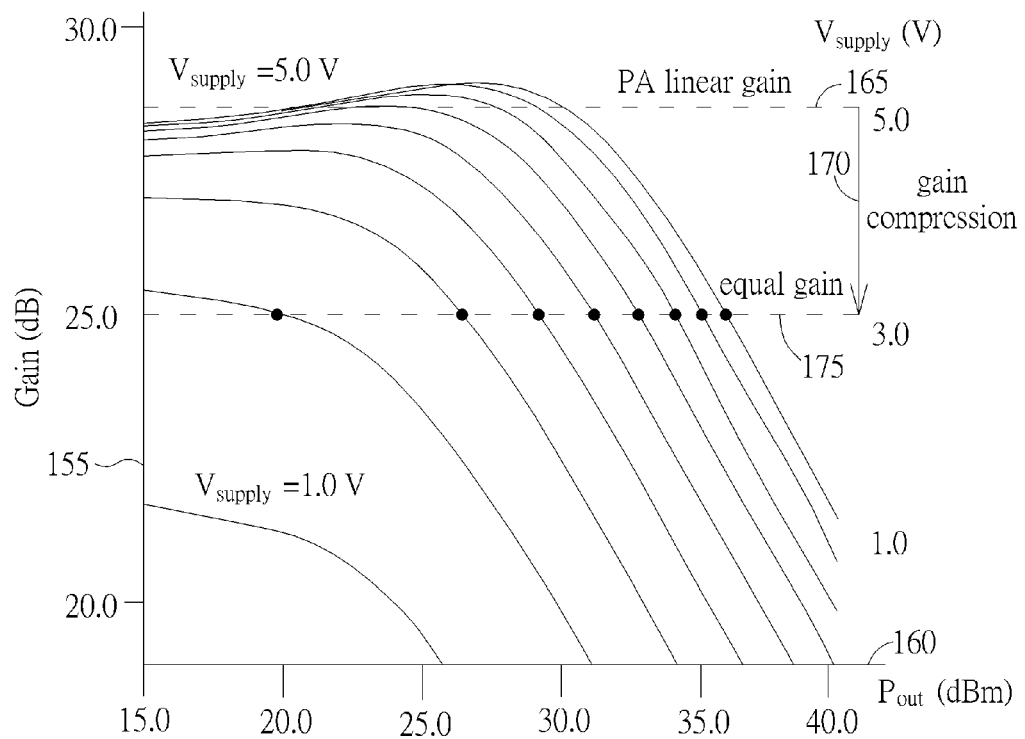
Figure 2:
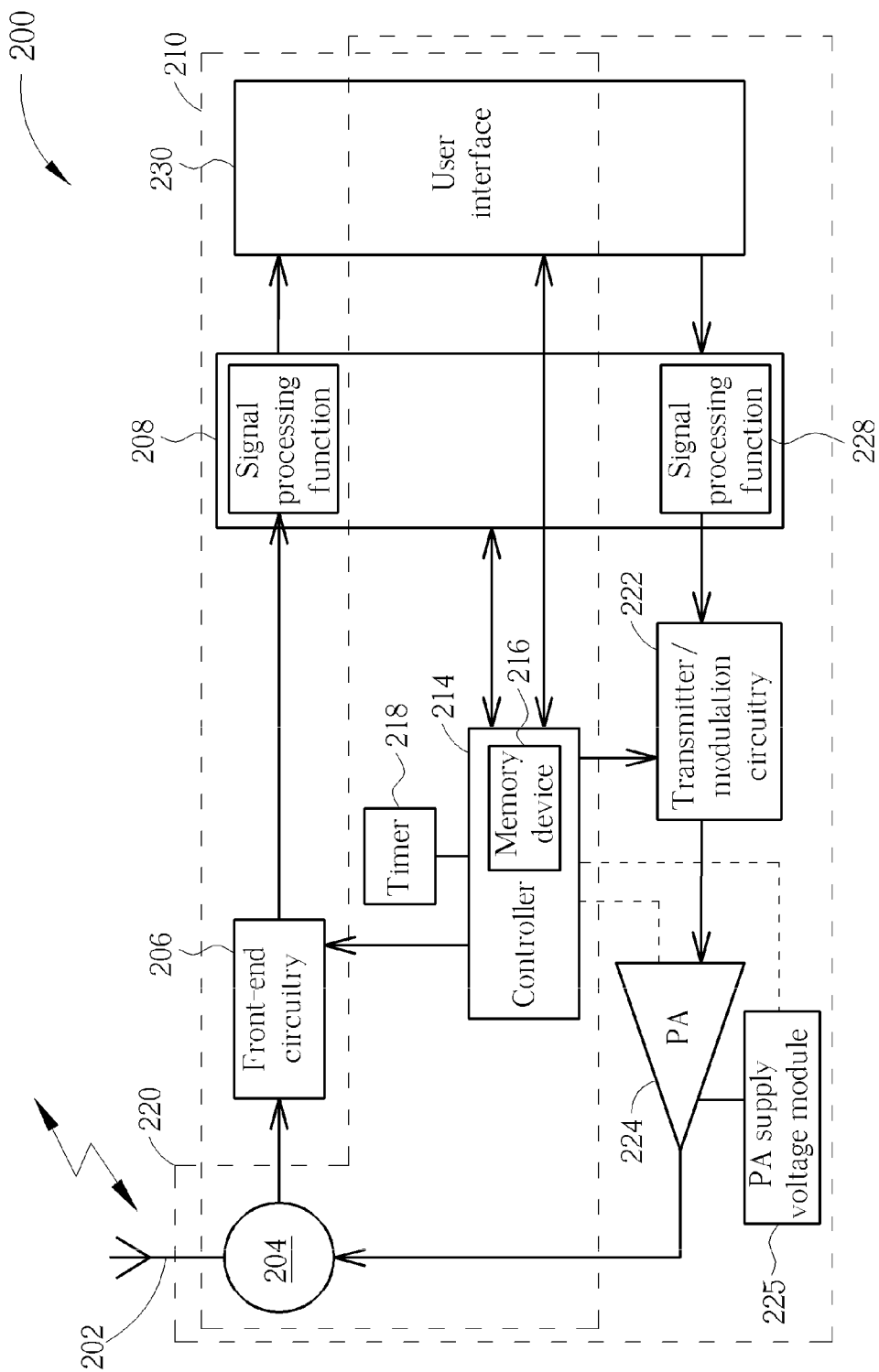
FIG. 2 illustrates a simplified block diagram of an example of a wireless communication unit.

Referring first to FIG. 2, a block diagram of a wireless communication unit (sometimes referred to as a mobile subscriber unit (MS) in the context of cellular communications or a user equipment (UE) in terms of a 3$^{rd}$ generation partnership project (3GPP™) communication system) is shown, in accordance with one example embodiment of the invention. The wireless communication unit 200 contains an antenna 202 preferably coupled to a duplex filter or antenna switch 204 that provides isolation between receive and transmit chains within the wireless communication unit 200.

The receiver chain 210, as known in the art, includes receiver front-end circuitry 206 (effectively providing reception, filtering and intermediate or base-band frequency conversion). The front-end circuitry 206 is coupled to a signal processor 208. An output from the signal processor 208 is provided to a suitable user interface 230, which may encompass a screen or flat panel display. A controller 214 maintains overall subscriber unit control and is coupled to the receiver front-end circuitry 206 and the signal processor 208 (generally realised by a digital signal processor (DSP)). The controller 214 is also coupled to a memory device 216 that selectively stores various operating regimes, such as decoding/encoding functions, synchronisation patterns, code sequences, and the like.

In accordance with examples of the invention, the memory device 216 stores modulation data, and power supply data for use in supply voltage control to track the envelope of the radio frequency waveform to be output by the wireless communication unit 200. Furthermore, a timer 218 is operably coupled to the controller 214 to control the timing of operations (transmission or reception of time-dependent signals and in a transmit sense the time domain variation of the PA supply voltage within the wireless communication unit 200).

As regards the transmit chain, this essentially includes the user interface 230, which may encompass a keypad or touch screen, coupled in series via signal processing function 228 to transmitter/modulation circuitry 222. The transmitter/modulation circuitry 222 processes input signals for transmission and modulates and up-converts these signals to a radio frequency (RF) signal for amplifying in the power amplifier module or integrated circuit 224. RF signals amplified by the PA module or PA integrated circuit 224 are passed to the antenna 202. The transmitter/modulation circuitry 222, power amplifier 224 and PA supply voltage module 225 are each operationally responsive to the controller 214, with the PA supply voltage module 225 additionally responding to a reproduction of the envelope modulated waveform from the transmitter/modulation circuitry 222.

The signal processor 228 in the transmit chain may be implemented as distinct from the signal processor 208 in the receive chain 210. Alternatively, a single processor may be used to implement processing of both transmit and receive signals, as shown in FIG. 2. Clearly, the various components within the wireless communication unit 200 can be realised in discrete or integrated component form, with an ultimate structure therefore being merely an application-specific or design selection.

Furthermore, in accordance with examples of the invention, the transmitter/modulation circuitry 222, together with power amplifier 224, PA supply voltage 225, memory device 216, timer function 218 and controller 214 have been adapted to generate a power supply to be applied to the PA 224. For example, a power supply is generated that is suitable for a wideband linear power amplifier, and configured to track the envelope waveform applied to the PA 224. In one example, an envelope tracking LUT is adapted by introducing digital pre-distortion (DPD) amplitude modulation-to-amplitude modulation (AM/AM) compensation in contrast to known equal-gain mapping implementations.

Figure 3:
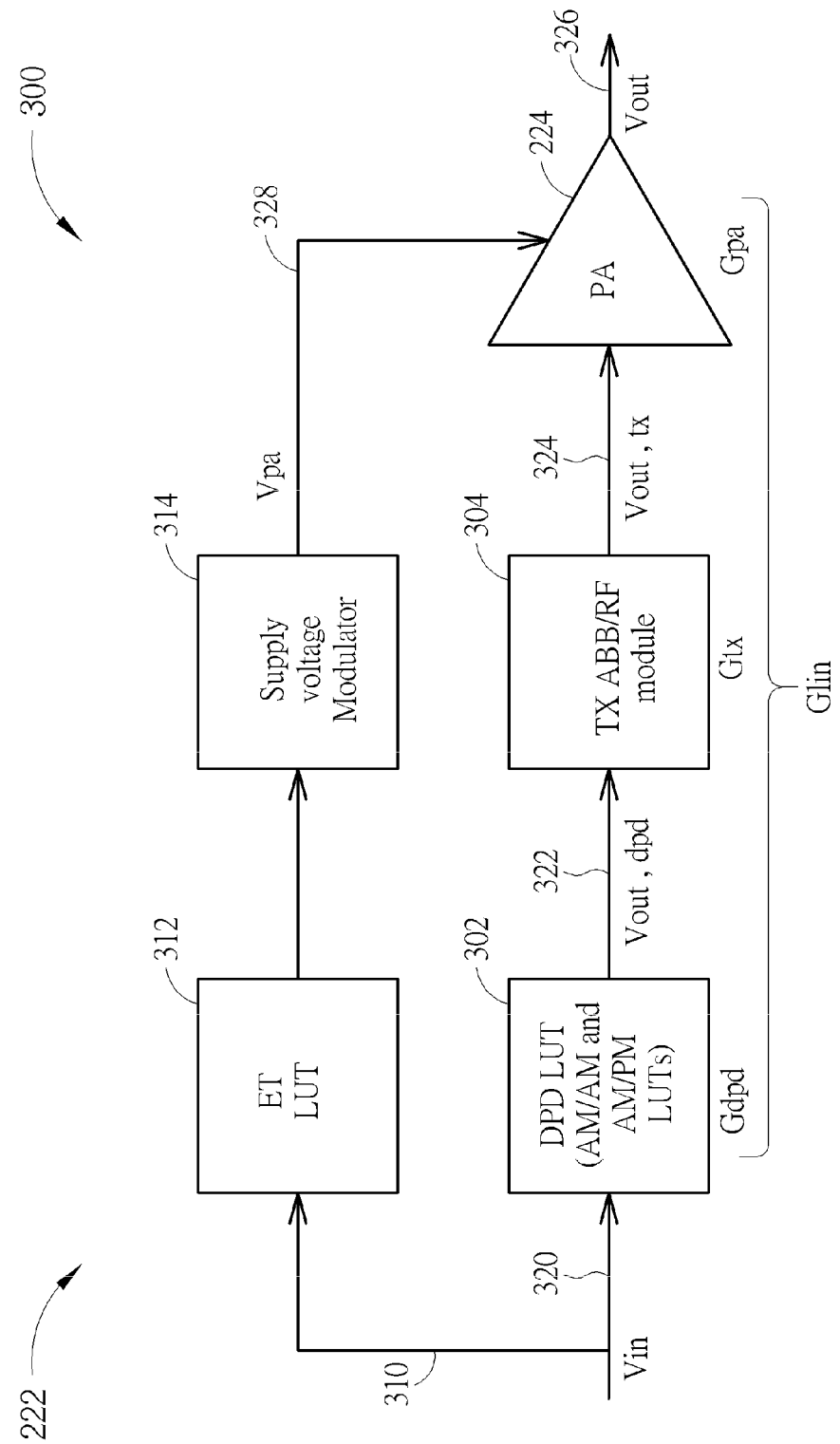
FIG. 3 illustrates a simplified generic block diagram of an example of a part of a radio frequency (RF) transceiver architecture.

Referring now to FIG. 3, there is illustrated a generic example block diagram of a part of an RF transmitter architecture 300 of a wireless communication unit, such as the wireless communication unit 200 illustrated in FIG. 2. The transmitter architecture 300 comprises at least a part of transmitter/modulation circuitry 222, for example that may be operationally responsive to the signal processor 228 and/or the controller 214 of FIG. 2, and a PA module 224. The transmitter/modulation circuitry 222 in this example comprises a digital input ($V_{in}$) applied to both a forward transmit path 320 and an envelope tracking path 310. The digital input ($V_{in}$) on the forward transmit path 320 is applied to a digital pre-distorter (DPD), comprising or operably coupled to at least one (DPD) look-up table (LUT) 302.

In one example, the at least one DPD LUT 302 may be configured as two LUTs, one LUT being designated as an amplitude modulation-to-amplitude modulation (AM/AM) LUT and one LUT being designated as an amplitude modulation to phase modulation (AM/PM) LUT.

In use, the at least one DPD LUT 302 provides a DPD output ($V_{out,dpd}$) to a transmit (TX) analogue baseband (ABB) and radio frequency (RF) module 304, which in some examples may include a digital-to-analog converter (DAC), low pass filter (LPF) to filter image signals and mixer to convert from baseband frequency to radio frequency prior to amplification by PA module 224. The output ($V_{out,tx}$) 324 from the TX ABB/RF module 304 is input to PA module 224, which in turn outputs 326 the output RF signal ($V_{out}$) via a duplex filter and/or an antenna switch and an antenna (not shown).

Thus, in this manner, output RF signal ($V_{out}$) may be defined as:

$$V_{out} = G_{lin} * V_{in} \quad [3]$$

Where: Glin is defined as the system linear gain. Hence, initially the at least one (DPD) look-up table (LUT) 302 needs to be calibrated/populated with DPD values by defining the system linear gain ($G_{lin}$) as:

$$G_{lin} = G_{dpd}(A(t)) + G_{tx}(A(t)) + G_{pa}(A(t)) = \text{const} \quad [4]$$

And a time variance of the input signal defined as:

$$A(t) = |V_{in}(t)| \quad [5]$$

This enables the DPD gain values to be derived and used to populate the at least one (DPD) look-up table (LUT) 302.

The envelope tracking path 310 is input to an envelope tracking module, which comprises or is operably coupled to at least one ET LUT 312. The envelope tracking module obtains from the at least one ET LUT 312 suitable values to control a supply voltage modulator 314. Examples of the invention describe a mechanism to acquire improved ET LUT values for an envelope tracking system with regard to system efficiency, RF transceiver capability, and/or baseband bandwidth requirement. The supply voltage modulator 314 is arranged to modulate the supply voltage applied to the PA module 224 in accordance with a power supply level indication obtained from the at least one ET LUT 312, for example residing within the controller 214 of FIG. 2.

Hence, following the at least one (DPD) look-up table (LUT) 302 being calibrated/populated with DPD values, the ET LUT 312 requires calibrating/populating in order to obtain a desired PA gain to be achieved, and therefore determine the Vpa to be applied to the PA module 224. In one example, the ET LUT 312 is calibrated/populated with values to additionally compensate for determined AM-AM values stored within the at least one (DPD) look-up table (LUT) 302.

In this manner, the supply voltage modulator 314, and corresponding envelope tracking module may be configured to perform envelope tracking modulation of the supply voltage provided to the PA module 224, such that the supply voltage provided to the PA module 224 substantially tracks an envelope of a RF waveform being amplified by the PA module 224. In particular, use of DPD gain compensation is applied to adaptively compress PA gain according to instantaneous PA output power, via calibration of the RF transmitter architecture 300 and appropriate population of the LUTs. Advantageously, there is no commensurate increase in RF transmitter output power capability requirement. Hereafter, the term instantaneous PA output power may encompass one or more of: instantaneous power, instantaneous envelope, instantaneous phase.

The supply voltage modulator 314, and corresponding envelope tracking module may form (at least a part of) an envelope tracking system of the RF transmitter architecture 300. It will be apparent that the present invention is not limited to the specific example RF transmitter architecture 300 illustrated in FIG. 3, and may equally be applied to other transceiver architectures. For example, in an alternative architecture the ET LUT 312 may be comprised of two or more LUTs.

Figure 4:
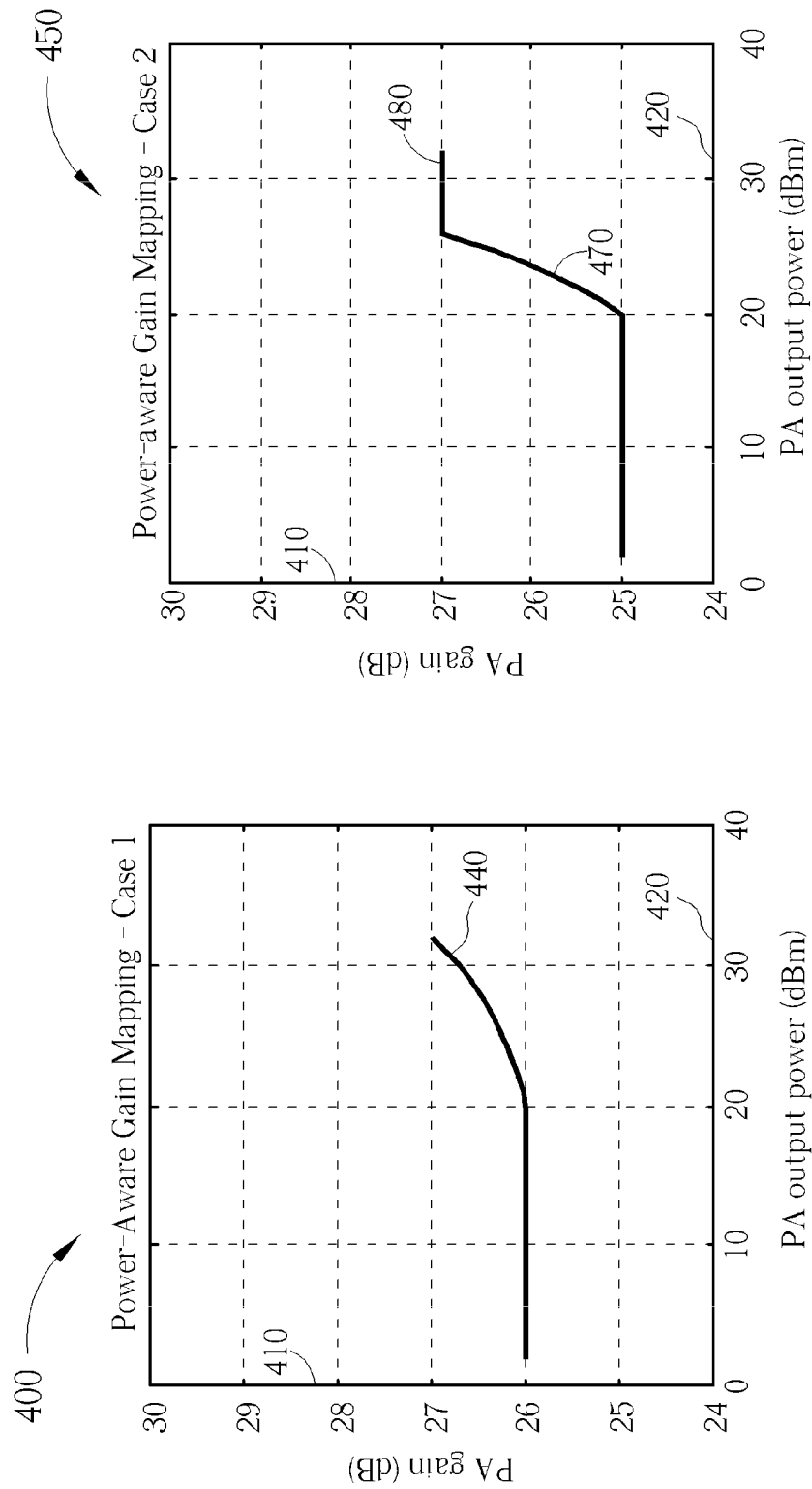
FIG. 4 illustrates a graph showing power amplifier gain versus power amplifier output power for various power-aware gain mapping techniques employable by the transceiver architecture of FIG. 3.

FIG. 4 illustrates two exemplary graphs 400, 450 showing power amplifier gain 410 versus power amplifier output power 420 for various power-aware gain mapping options employable by the transmitter architecture 300 of FIG. 3. For example, in a first case 400, when the output power at 440 is close to a PA saturation power, the PA gain at 440 will be compressed less, thereby relaxing RF transceiver output power requirement at such high output powers. It has been determined that the efficiency at higher output powers (of say 23~26 dBm) in the first case 400 is close to an equal-gain setting of 24 dB but advantageously the corresponding Vpa has a smaller high-frequency component than a second case 450. Hence, a trade-off between the efficiency improvement and signal bandwidth on the envelope tracking path 310 can be obtained.

Alternatively, a second case 450, when the output power at 470 is several dB smaller than PA saturation power at 480, the PA gain will be compressed more, as shown by 470, as the output power decreases, thereby improving PA efficiency at low PA output power. In this manner, the ET operation range may be increased as the efficiency at lower output power is improved.

Figure 5:
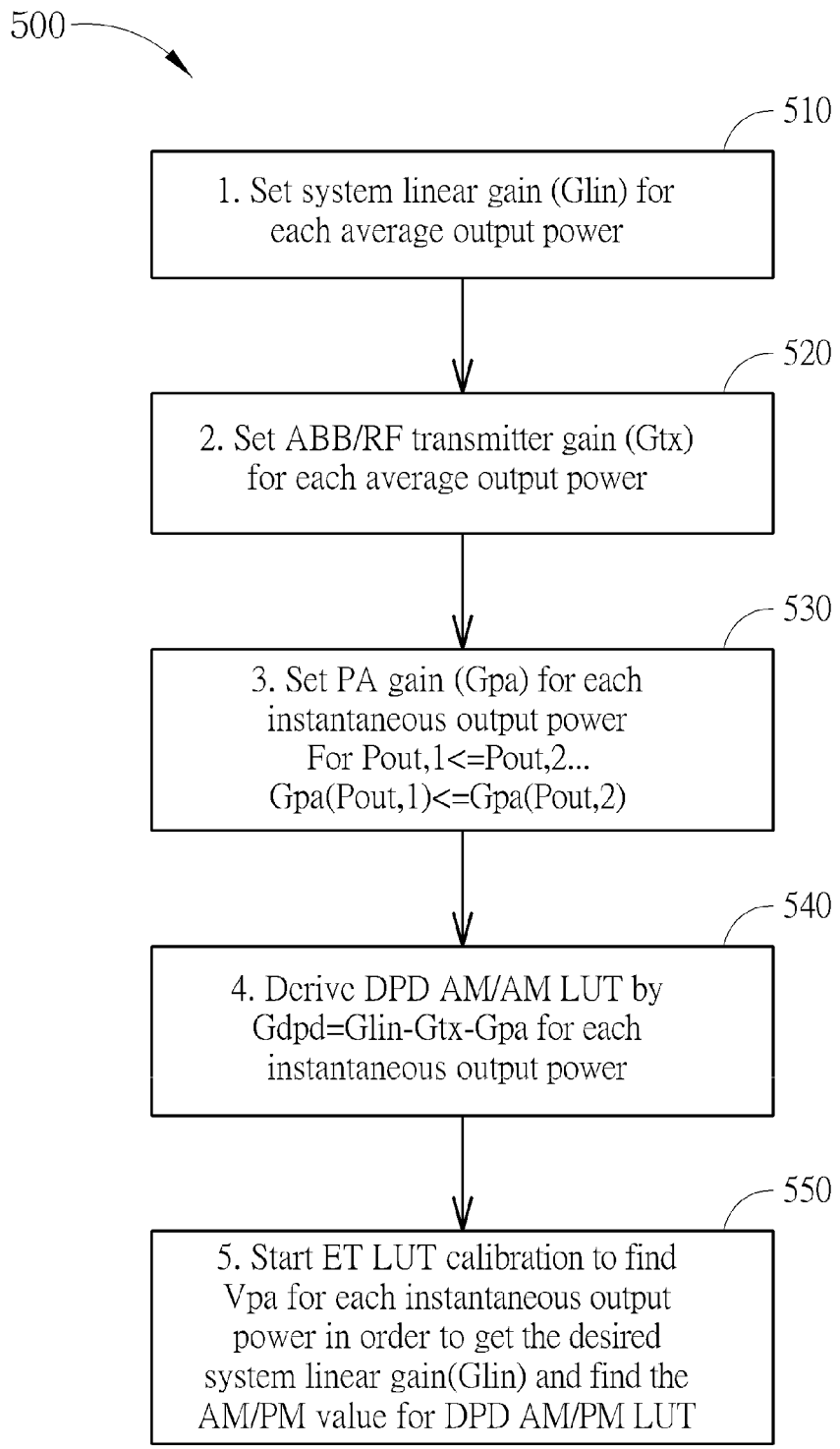
FIG. 5 illustrates a simplified flowchart of an example of generating envelope tracking look-up tables within an RF transceiver.

FIG. 5 illustrates a simplified flowchart 500 of an example of generating at least one envelope tracking look-up table(s) within an RF transceiver. The simplified flowchart 500 commences in 510 with the system linear gain ($G_{lin}$) being set/defined for each average output power that may be output from the PA, such as PA 224 in FIG. 3. Here, the term average power encompasses the averaged power over a specific period in the communication system, for example one subframe in an LTE implementation. At 520, the process then moves to the analogue baseband (ABB) (which in one example may encompass a digital to analog converter and low pass filter) & RF transmitter gain ($G_{tx}$) being set/defined for each average output power that may be output from the PA, such as PA 224 in FIG. 3.

At 530, the process then moves to the PA gain ($G_{pa}$) being set/defined for each instantaneous output power that may be output from the PA, such as PA 224 in FIG. 3. In one example, the instantaneous output power, and consequently the respective PA gains ($G_{pa}$) may follow the relationship:

$$\text{For } Pout,1 \leq Pout,2 \ldots Gpa(Pout,1) \leq Gpa(Pout,2) \quad [1]$$

Where:

Pout,1 and Pout,2 are two possible instantaneous PA output powers, and

Gpa (Pout,1) and Gpa (Pout,2) are the respective PA gains.

At 540, the process then moves to the DPD gain ($G_{dpd}$) being derived for each instantaneous output power and the amplitude modulated-to-amplitude modulated (AM/AM) LUT being completed first. In one example, the LUT values for $G_{dpd}$ may be determined based on the following equation:

$$G_{dpd} = G_{lin} - G_{tx} - G_{pa} \quad [2]$$

At 550, once the AM/AM values have been populated in the LUT, the process then moves to populating the AM/PM values by commencing the envelope tracking (ET) calibration. Here, Vpa is determined for each instantaneous output power in order to obtain a desired system linear gain ($G_{lin}$) and determine therefrom the amplitude modulated-to-phase modulated (AM/PM) values to populate an AM/PM LUT. The AM/AM and AM/PM LUTs are then populated and ready for use.

Figure 6:
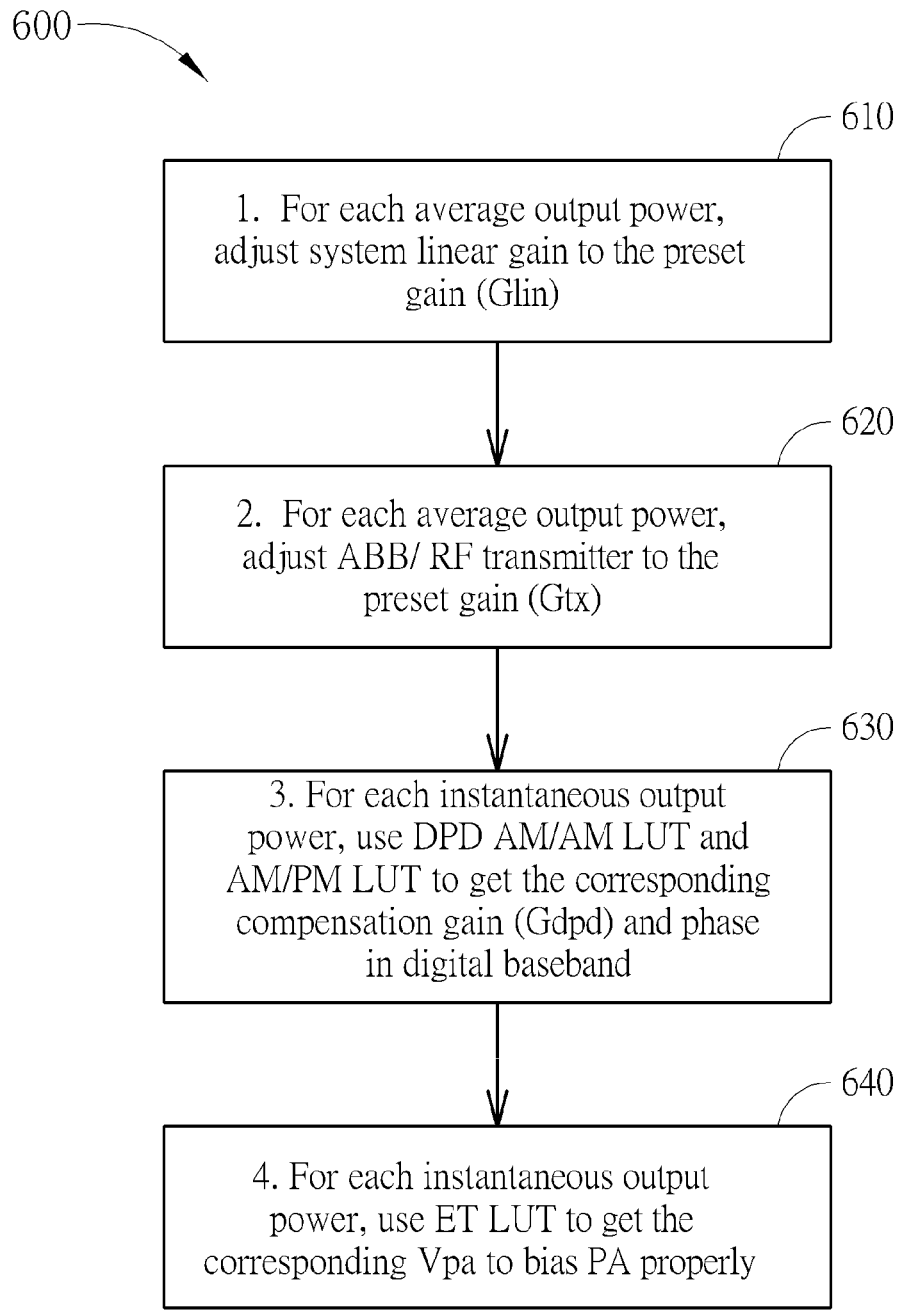
FIG. 6 illustrates a simplified flowchart of an example of a use of the envelope tracking look-up tables generated in FIG. 5.

FIG. 6 illustrates a simplified flowchart 600 of an example of a use of the at least one envelope tracking look-up table(s) generated in FIG. 5. The simplified flowchart 600 commences in 610 with the system linear gain being adjusted to the preset gain ($G_{lin}$) for each average output power that is output from the PA, such as PA 224 in FIG. 3. Here, the term average power encompasses the averaged power over a specific period in the communication system, for example one subframe in an LTE implementation. At 620, the process then moves to the analogue baseband (ABB) (which in one example may encompass a digital to analog converter and low pass filter) & RF transmitter gain being adjusted to the preset gain ($G_{tx}$) for each average output power that is output from the PA, such as PA 224 in FIG. 3.

At 630, the process then moves to using the DPD gain from both the generated AM/AM LUT and AM/PM LUT to obtain a corresponding compensation gain ($G_{dpd}$) and phase for setting in the digital baseband, for example DPD AM/AM and AM/PM LUTs 302 in FIG. 3. Finally, in 640, for each instantaneous output power, the values obtained from the ET LUT (say ET LUT 312 from FIG. 3) are used to obtain a corresponding PA supply voltage ($V_{pa}$) in order to properly bias the PA, say PA 224 of FIG. 3. In this manner, DPD gain compensation may be applied to adaptively compress PA gain according to the instantaneous PA output power. For example, when the output power is close to a PA saturation power, the PA gain will be compressed less, thereby improving PA efficiency at high output power. Alternatively, when the output power is several dB smaller than PA saturation power, the PA gain will be compressed more as the output power decreases. In this manner, the ET operation range may be increased as the efficiency at lower output power is improved. Advantageously, there is no commensurate increase in RF transmitter output power capability requirement.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the various components/modules, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A method of envelope tracking calibration for a supply voltage to a power amplifier within a radio frequency transmitter, comprising: applying an envelope signal that varies with time to an input of the radio frequency transmitter; determining when an instantaneous output power signal for the power amplifier is close to a power amplifier saturation power; mapping a gain of the power amplifier to an instantaneous output of a waveform signal amplified by the power amplifier; adaptively adjusting a gain compression of the power amplifier by using values stored in an amplitude modulation-to-amplitude modulation (AM-AM) table and an amplitude modulation-to-phase modulation (AM-PM) table of a digital predistorter, wherein the gain is compressed less when the instantaneous output power signal is close to the power amplifier saturation power and compressed more when the instantaneous output power signal is several dB smaller than the power amplifier saturation power; applying a supply voltage to the power amplifier based on the mapping and the power amplifier compression; and performing envelope tracking calibration based upon the input envelope supply voltage signal and the instantaneous output power signal.

2. The method of claim 1, wherein mapping the gain of the power amplifier module to the instantaneous power comprises monotonically increasing a power amplifier gain as a function of power amplifier output power.

3. The method of claim 1, wherein mapping the gain of the power amplifier module to the instantaneous power comprises mapping a reduction in power amplifier gain as the instantaneous power of the power amplifier output decreases.

4. The method of claim 1 wherein mapping the gain of the power amplifier module to the instantaneous power of a waveform signal to be amplified by the power amplifier module comprises:
determining a system linear gain for at least one average output power that may be output from the power amplifier module;
determining a transmitter gain setting for at least one average output power that may be output from the power amplifier module;
determining a gain setting of the power amplifier module for at least one instantaneous output power from the power amplifier module; and
determining therefrom digital predistortion gain compensation to be applied to a digital predistorter to adaptively compress power amplifier module gain according to the at least one instantaneous output power.

5. The method of claim 1 further comprising performing envelope tracking (ET) calibration by determining a supply voltage to be applied to the power amplifier module for the instantaneous output power signal.

6. The method of claim 5 further comprising determining therefrom amplitude modulated-to-phase modulated, AM-PM, compensation to be applied to the DPD to achieve the instantaneous output power signal to be output from the power amplifier module.

7. The method of claim 6 further comprising applying the DPD AM-PM compensation when power amplifier gain compression is high.

8. The method of claim 6 further comprising storing DPD AM-PM compensation values in the at least one DPD look-up table.

9. The method of claim 6 further comprising mapping DPD AM-PM compensation values in a first look-up table and mapping DPD AM-AM compensation values in a second look-up table.

10. The method of claim 1 further comprising determining an indication of at least one instantaneous output signal value for the power amplifier module and comparing the at least one instantaneous output signal value with a PA saturation power value.

11. The method of claim 10, wherein the at least one instantaneous output signal value comprises at least one of: instantaneous power, instantaneous envelope, instantaneous phase.

12. A non-transitory computer program product embodied with executable program code for envelope tracking calibration for a supply voltage for a power amplifier module within a radio frequency, RF, transmitter of a wireless communication unit, the executable program code operable for, when executed at a communication unit, performing the method of claim 1.

13. A communication unit, comprising: an envelope tracking system for supplying voltage to a power amplifier within a radio frequency transmitter and at least one signal processing module operably coupled to the radio transmitter for calibrating envelope tracking system and configured to: apply an envelope signal that varies with time to an input of the radio frequency transmitter; determine when an instantaneous output power signal for the power amplifier is close to a power amplifier saturation power; map a gain of the power amplifier to an instantaneous output of a waveform signal amplified by the power amplifier; adaptively adjust a gain compression of the power amplifier by using values stored in an amplitude modulation-to-amplitude modulation (AM-AM) table and an amplitude modulation-to-phase modulation (AM-PM) table of a digital predistorter, wherein the gain is compression less when the instantaneous output power signal is close to the power amplifier saturation power and compression more when the instantaneous output power signal is several dB smaller than the power amplifier saturation power; apply a supply voltage to the power amplifier based on the mapping and the power amplifier compression; and perform envelope tracking calibration based upon the input envelope supply voltage signal and the instantaneous output power signal.

14. An integrated circuit for a communication unit, comprising: an envelope tracking system for supplying voltage to a power amplifier within a radio frequency transmitter, wherein the integrated circuit comprises at least one signal processing module for calibrating envelope tracking system and configuring to: apply an envelope signal that varies with time to an input of the radio frequency transmitter; determine when an instantaneous output power signal for the power amplifier is close to a power amplifier saturation power; map a gain of the power amplifier to an instantaneous output of a waveform signal amplified by the power amplifier; adaptively adjust a gain compression of the power amplifier by using values stored in an amplitude modulation-to-amplitude modulation (AM-AM) table and an amplitude modulation-to-phase modulation (AM-PM) table of a digital predistorter, wherein the gain is compressed less when the instantaneous output power signal is close to the power amplifier saturation power and compressed more when the instantaneous output power signal is several dB smaller than the power amplifier saturation power; apply a supply voltage to the power amplifier based on the mapping and the power amplifier compression; and perform envelope tracking calibration based upon the input envelope supply voltage signal and the instantaneous output power signal.

15. The communication unit of claim 13, wherein the at least one signal processing module is arranged to map the gain of the power amplifier to the instantaneous power through monotonically increasing a power amplifier gain as a function of power amplifier output power.

16. The communication unit of claim 13, wherein the at least one signal processing module is arranged to map the gain of the power amplifier module to the instantaneous power through mapping a reduction in power amplifier gain as the instantaneous power of the power amplifier output decreases.

17. The integrated circuit of claim 14, wherein the at least one signal processing module is arranged to map the gain of the power amplifier module to the instantaneous power through monotonically increasing a power amplifier gain as a function of power amplifier output power.

18. The integrated circuit of claim 14, wherein the at least one signal processing module is arranged to map the gain of the power amplifier module to the instantaneous power through mapping a reduction in power amplifier gain as the instantaneous power of the power amplifier output decreases.

* * * * *